(12) United States Patent
Fischer et al.

(10) Patent No.: US 9,116,212 B2
(45) Date of Patent: Aug. 25, 2015

(54) PEDIATRIC COIL ASSEMBLY

(75) Inventors: Hubertus Fischer, Bamberg (DE);
Hiroyuki Fujita, Highland Heights, OH (US); Joseph Herczak, Munson, OH (US); Lars Lauer, Nürnberg (DE)

(73) Assignees: Siemens Aktiengesellschaft, München (DE); Quality Electrodynamics, Mayfield, OH (US)

( * ) Notice: Subject to any disclaimer, the term of this patent is extended or adjusted under 35 U.S.C. 154(b) by 613 days.

(21) Appl. No.: 12/950,746

(22) Filed: Nov. 19, 2010

(65) Prior Publication Data
US 2012/0126814 A1    May 24, 2012

(51) Int. Cl.
*G01V 3/00* (2006.01)
*G01R 33/34* (2006.01)
*G01R 33/30* (2006.01)
*G01R 33/3415* (2006.01)

(52) U.S. Cl.
CPC .......... *G01R 33/34084* (2013.01); *G01R 33/30* (2013.01); *G01R 33/34007* (2013.01); *G01R 33/3415* (2013.01); *G01R 33/34046* (2013.01)

(58) Field of Classification Search
CPC .. G01R 33/34; G01R 33/44; G01R 33/34084; G01R 33/30; G01R 33/34007; G01R 33/34046; G01R 33/3415
USPC ............................ 324/300–322; 600/407–464
See application file for complete search history.

(56) References Cited

U.S. PATENT DOCUMENTS

| | | | |
|---|---|---|---|
| 6,577,888 B1 * | 6/2003 | Chan et al. | 600/422 |
| 6,611,702 B2 * | 8/2003 | Rohling et al. | 600/415 |
| 6,778,849 B1 * | 8/2004 | Ninomiya et al. | 600/422 |
| 6,867,593 B2 * | 3/2005 | Menon et al. | 324/318 |

(Continued)

FOREIGN PATENT DOCUMENTS

| | | |
|---|---|---|
| CN | 1411785 A | 4/2003 |
| CN | 101385647 A | 3/2009 |
| WO | WO2009156117 A2 | 12/2009 |

OTHER PUBLICATIONS

"Elite Pediatric Clinical Solutions," Philips, 1 page, downloaded from the internet on Oct. 27, 2010: http://www.healthcare.philips.com/main/products/mri/clinical_solutions//pediatric/index.wpd.

(Continued)

*Primary Examiner* — Melissa Koval
*Assistant Examiner* — Daniel Miller
(74) *Attorney, Agent, or Firm* — Lempia Summerfield Katz LLC

(57) ABSTRACT

In order to increase the signal to noise ratio, and thus increase the quality of images produced during pediatric MRI, a pediatric RF coil assembly includes a head coil and a flexible body coil in a single dedicated device shaped and sized for a child. The flexible body coil may be operable to at least partially surround and abut the body of the child located on the pediatric RF coil assembly, while the head coil may at least partially surround and abut the head of the child located on the pediatric RF coil assembly. In order to optimize workflow, the child may be positioned on the pediatric RF coil assembly in a first room and moved to a second room including an MRI system after the child is brought to sleep or sedated in the first room. The pediatric RF coil assembly and the child may be moved to the second room using a handle rotatably attached to the pediatric RF coil assembly, and may be positioned on a patient table of the MRI system when the imaging process is to begin.

13 Claims, 5 Drawing Sheets

(56) References Cited

U.S. PATENT DOCUMENTS

| | | | |
|---|---|---|---|
| 8,147,396 B2* | 4/2012 | Srinivasan | 600/22 |
| 2002/0173717 A1 | 11/2002 | Rohling et al. | |
| 2003/0076101 A1 | 4/2003 | Sakuma et al. | |
| 2004/0106336 A1 | 6/2004 | Menon et al. | |
| 2005/0113668 A1 | 5/2005 | Srinivasan | |
| 2009/0009172 A1* | 1/2009 | Feld et al. | 324/321 |
| 2011/0118535 A1 | 5/2011 | Muntermann | |
| 2012/0133366 A1* | 5/2012 | Davis et al. | 324/318 |

OTHER PUBLICATIONS

"Neonate Head Coil," Advanced Imaging Research, 2009 SREE Medical Systems, 1 page, downloaded from the internet on Oct. 27, 2010: http://www.advimg.com/neonate_heal_coil.html.

"Infant Cardiac Array," Advanced Imaging Research, 2009 SREE Medical Systems, 1 page, downloaded from the internet on Oct. 27, 2010: http://www.advimg.com/infant_cardiac_array.html.

Chinese Office Action dated Jul. 2, 2014 for corresponding Chinese Patent Application No. 201110365350.4 with English translation.

* cited by examiner

PEDIATRIC COIL ASSEMBLY

FIELD

The present embodiments relate to a pediatric coil assembly for a magnetic resonance imaging system.

BACKGROUND

Magnetic resonance imaging (MRI) is a non-invasive imaging technique that may be used to display detailed tissue structures in the body of a patient. The displayed tissue structure may provide valuable information assisting in the diagnosis and treatment of various medical conditions.

An MRI system may include three components or sub-systems: a magnet with a main magnetic field, a gradient system, and a radiofrequency (RF) system. The main magnetic field produced by the magnet aligns the nuclear magnetization of atoms in the body of the patient. The gradient system spatially varies the main magnetic field with corresponding pairs of gradient coils, such that the position of a slice to be imaged may be precisely located. The RF system includes antennas (e.g., coils) that are used to send RF pulses (e.g., transmitter coils) and/or receive magnetic resonance (MR) signals (e.g., receiver coils). The RF pulses produce an electromagnetic field that flips or changes the alignment of the nuclear magnetization of the atoms. When the electromagnetic field is turned off, the nuclear magnetization of the atoms decays to the natural alignment of the atoms within the main magnetic field, and the atoms release excess stored energy. When the atoms release the excess stored energy, the atoms give off MR signals that are received by the receiver coils of the RF system and are used to construct image slices. The signal strength in a receiver coil depends on the volume of excitation in the coil and the distance to the object to be measured. The noise in the MR signal, however, depends largely on the size of the coil.

MRI systems may be used to diagnose various medical conditions in children (e.g., pediatric MRI). Standard RF coils originally designed for other applications may be used for pediatric MRI. For example, a knee coil for an adult patient may be used to image the entire body of a baby. Pillows and/or other filing materials may be used to help keep the child in a fixed position during imaging. Drugs for sedation may also be used to keep the child in a fixed position. These filling materials may result in an unknown or undesired geometric relationship between a coil and the body of the patient. The coil size and poor filling may result in limitations to the signal to noise ratio and thus the image quality.

SUMMARY

In order to increase the signal to noise ratio, and thus increase the quality of images produced during pediatric MRI, a pediatric RF coil assembly includes a head coil and a flexible body coil in a single dedicated device shaped and sized for a child. The flexible body coil may be operable to at least partially surround and abut the body of the child located on the pediatric RF coil assembly, while the head coil may at least partially surround and abut the head of the child located on the pediatric RF coil assembly. In order to optimize workflow, the child may be positioned on the pediatric RF coil assembly in a first room and moved to a second room including an MRI system after the child is brought to sleep or sedated in the first room. The pediatric RF coil assembly and the child may be moved to the second room using a handle rotatably attached to the pediatric RF coil assembly, and may be positioned on a patient table of the MRI system when the imaging process is to begin.

In one embodiment, a radiofrequency (RF) coil assembly includes a flexible body portion including an RF coil and being operable to flex to at least partially surround the body of a patient. The RF coil assembly includes a head portion that includes an RF coil and at least partially surrounds the head of the patient located on the RF coil assembly. The RF coil assembly also includes a coil connector electrically connected to the RF coil of the flexible body portion and the RF coil of the head portion.

In another embodiment, a pediatric RF coil assembly includes a base including a first RF coil, and a flexible body coil housing supported by the base, the flexible body coil housing including a second RF coil. The pediatric RF coil assembly also includes a head coil housing removably attached to the base, the head coil housing including a third RF coil and operable to at least partially surround the head of a patient located on the RF coil assembly.

In yet another embodiment, a method of using a pediatric RF coil assembly includes positioning a patient on the pediatric RF coil assembly in a first room and transferring the pediatric RF coil assembly and the patient to a second room, the second room including a magnetic resonance imaging (MRI) system. The method of using the pediatric RF coil assembly also includes electrically connecting the pediatric RF coil assembly to the MRI system and imaging a portion of the patient using the MRI system and at least one coil in the pediatric RF coil assembly.

DETAILED DESCRIPTION OF THE DRAWINGS

Figure 1:
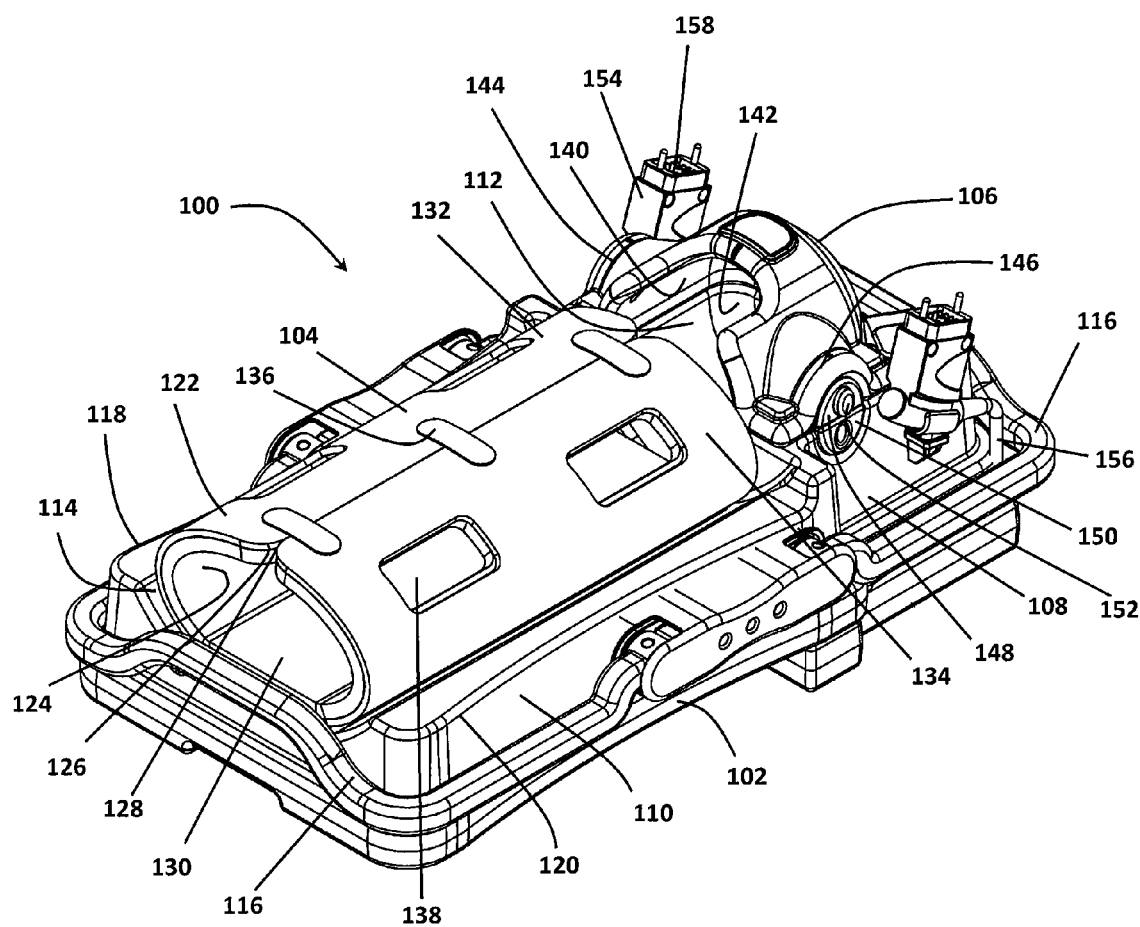
FIG. 1 illustrates an isometric view of one embodiment of a pediatric coil assembly.

FIG. 1 illustrates an isometric view of one embodiment of a pediatric coil assembly 100. The pediatric coil assembly 100 includes a base 102, a body coil housing 104 (e.g., a flexible body portion), and a head coil housing 106 (e.g., a head portion).

The base 102 includes a first part 108 and a second part 110. The first part 108 of the base 102 includes a hole or recess 112 shaped and sized for the head of a patient (e.g., a child up to the age of four). For example, the recess 112 is 14 cm in diameter. The second part 110 of the base 102 includes a channel 114 extending along at least part of the length of the second part 110 of the base 102, shaped and sized for the body of the patient. For example, the channel 114 is 27 cm in diameter and 44 cm long. The first part 108 and the second part 110 of the base 102 may be rigid, such that walls that form the recess 112 and the channel help maintain the patient within the pediatric coil assembly 100. The first part 108 and the second part 110 of the base 102 may be made of any number of MRI safe materials (i.e., materials that do not produce proton or magnetic signals) including, for example, polycarbonate. The first part 108 and/or the second part 110 of the base 102 may be hollow or solid. In one embodiment, the second part 110 of the base 102 does not include a channel 114, and a top surface of the second part 110 of the base 102 is flat.

A plurality of radiofrequency (RF) receive coils (not shown) is located within the base 102. The plurality of RF receive coils may be positionally fixed within the base 102. For example, the plurality of RF receive coils may be embedded within a solid part of the base 102 or may be physically attached to an internal surface of the base 102. The plurality of RF receive coils may be spaced along the length of the base 102 (e.g., along the length of the first part 108 and the second part 110 of the base 102), such that MR signals may be received from the back side of the body (e.g., the spine) and head of the patient during MRI. In one embodiment, the base 102 includes both RF transmit coils and RF receive coils. In another embodiment, the base 102 includes an opening (not shown), such that at least one RF receive coil may be moved to a different position within the base 102 to image a different part of the patient.

The plurality of RF receive coils may be made of any number of electrically conducting materials including, for example, copper. The plurality of RF receive coils of the base 102 may include, for example, surface coils, volume coils, or a combination thereof. For example, the first part 108 of the base 102 may include a volume coil, while the second part 110 of the base 102 may include a plurality of surface coils. In alternative embodiments, the base 102 may include only a single RF receive coil or may not include any RF receive coils at all.

The base 102 also includes one or more handles 116 (e.g., two handles 116) that may be used to move the pediatric coil assembly 100 and the patient located in the pediatric coil assembly 100. Each of the two handles 116 may be rotatably attached to the base 102 at or adjacent to a first side 118 and a second side 120 of the base 102. In an alternative embodiment, one handle 116 is rotatably attached to the first side 118 of the base, and another handle 116 is rotatably attached to the second side 120 of the base 102. The base 102 may include more or fewer handles 116 rotatably attached or fixed to the base 102. Non-rotatable handles may also be used.

The body coil housing 104 includes an outer surface 122, an inner surface 124, a first half or side 126 and a second half or side 128. The body coil housing 104 may also include two or more sections, such as a first section 130, a second section 132 and a third section 134, around a circumference. For example, the second and third sections 132, 134 may attach to and extend away from opposite sides of the first section 130. The sections 132 and 134 are attached by hinges, flexible material, or formed as a single integral piece. The first section 130 of the body coil housing 104 may be rigid, while the second and third sections 132 and 134 of the body coil housing 104 may be flexible (e.g., flexible sections). For example, at least part of the first section 130 may be made of polycarbonate, while the second section 132 and the third section 134 may be made of closed-cell foam. In one embodiment, the entire body coil housing 104 is made of a single piece of closed-cell foam. The closed-cell foam of the flexible sections 132 and 134 may serve as a blanket for the patient, may be easily cleaned and may be waterproof. The body coil housing 104 may be generally rectangular, for example. "Generally" allows for rounded corners of the rectangular body coil housing 104 and other shapes. As another example, the sections 132 and 134 are flexible by being rigid structures rotatably connected with the first section 130 by a hinge or other flexible structure. One section 132, 134 may be fixed in place while the other section 132, 134 is flexibly connected to the first section 130.

At least part of the outer surface 122 of the body coil housing 104 is supported by the surface of the channel 114 of the base 102. Fasteners (e.g., Velcro strips; not shown) may be used to removably attach the outer surface 122 of the body coil housing 104 to the surface of the channel 114 of the base 102. In one embodiment, no fasteners are used to physically attach the body coil housing 104 to the base 102.

The patient is positioned on the inner surface 124 of the first section 130 of the body coil housing 104. The flexible sections 132 and 134 may be folded around the body of the patient (i.e., the flexible sections 132 and 134 at least partially surround the body of the patient), and a plurality of fasteners 136 (e.g., three fasteners 136) may be used to fix the position of the first side 126 of the body coil housing 104 relative to the second side 128 of the body coil housing 104 above the body of the patient. Any number of fasteners 136 including, for example, Velcro strips may be used. In the embodiment shown in FIG. 1, the first side 126 of the body coil housing 104 abuts the second side 128 of the body coil housing 104, and the plurality of fasteners 136 is attached to the outer surface 122 of the body coil housing 104 at and adjacent to the first side 126 and the second side 128. The size and dimensions of the plurality of fasteners 136 may be determined by the size of the patient positioned on the body coil housing 104. For example, the body coil housing 104 may not wrap entirely around a larger child, and larger fasteners (e.g., fasteners with a greater length) may be used to fix the position of the first side 126 of the body coil housing 104 relative to the second side 128 of the body coil housing 104. Depending on the application, the flexible sections 132 and 134 may not be wrapped around the body of the patient at all.

The body coil housing 104 may include a plurality of openings 138 (e.g., four openings 138) to facilitate additional positioning of the patient after the flexible sections 132 and 134 have been positioned around the body of the patient, and the position of the first side 126 of the body coil housing 104 has been fixed relative to the second side 128 of the body coil housing 104 with the plurality of fasteners 136. The body coil housing 104 may include more, fewer or no openings 138 at all.

A plurality of RF receive coils (not shown) is integrated within the body coil housing 104. The plurality of RF receive coils is positionally fixed within the body coil housing 104. The plurality of RF receive coils may be located within the first section 130, the second section 132 and/or the third section 134 of the body coil housing 104. The plurality of RF receive coils may be spaced along the length and width of the body coil housing 104 (e.g., in a grid-like structure), such that MR signals may be received from the back, the front and the sides of the body of the patient during MRI. In one embodiment, the plurality of RF receive coils is integrated within the body coil housing 104, such that the closed-cell foam of the flexible sections 132, 134 surrounds and abuts all or part of at least some of the RF receive coils of the plurality. The polycarbonate and/or the closed-cell foam of the first section 130 of the body coil housing 104 may also surround and abut all or part of at least some of the RF receive coils of the plurality. In one embodiment, the body coil housing 104 includes both RF transmit coils and RF receive coils.

The plurality of RF receive coils of the body coil housing 104 are flexible and may be made of any number of electrically conducting materials including, for example, copper. The plurality of RF receive coils of the body coil housing 104 may include, for example, surface coils, volume coils, or a combination thereof. In one embodiment, the body coil housing 104 includes a plurality of surface coils. In another embodiment, the body coil housing 104 includes only a single volume coil.

The body coil housing 104 may also include an integrated printed circuit board (PCB; not shown). The PCB of the body coil housing 104 may be integrated into the first section 130 of the body coil housing 104. In other words, the PCB may be enclosed in the first section 130 of the body coil housing 104. The PCB may be a flexible, multilayered PCB, for example. At least one low-noise amplifier (not shown) is electrically connected to the PCB of the body coil housing 104. The MR signals received by the RF receive coils of the body coil housing 104 are very weak; the one or more low-noise amplifiers reduce noise and interference signals, while also increasing the voltage range of the MR signals. The PCB of the body coil housing 104 may include more or fewer low-noise amplifiers than the number of RF receive coils of the body coil housing 104. The PCB of the body coil housing 104 may include any number of different, additional, fewer, or other electrical hardware components such as, for example, doubly balanced mixers, analog to digital converters, specialized processors (e.g., application specific integrated circuits (ASICs)), generalized processors, flash memory, resistors and capacitors electrically connected to the PCB of the body coil housing 104.

The plurality of RF receive coils of the body coil housing 104 are electrically connected to inputs of the PCB of the body coil housing 104 via a plurality of corresponding electrical cables (e.g., input electrical cables; not shown). An electrical cable may be electrically connected to (e.g., soldered to) a corresponding RF receive coil of the body coil housing 104 and an input of the PCB of the body coil housing 104. The plurality of electrical cables may be, for example, coaxial cables. The plurality of coaxial cables of the body coil housing 104 may be electrically connected to one or more coaxial cable input connectors electrically connected (e.g., soldered) to the PCB of the body coil housing 104. Alternatively, the RF receive coils of the body coil housing 104 may be electrically connected to the PCB of the body coil housing 104 with short leads or may be directly soldered to the PCB of the body coil housing 104. In one embodiment, some or all of the coaxial cable input connectors may be accessible by a user at the outer surface 122 of the first section 130 of the body coil housing 104 (i.e., some or all of the coaxial cable connectors protrude out of the body coil housing 104).

One or more electrical output connectors may be electrically connected (e.g., soldered) to outputs of the PCB of the body coil housing 104; the one or more electrical output connectors may be physically attached to and electrically connected to one or more corresponding electrical connectors located at the second part 110 of the base 102 or elsewhere. Alternatively, a plurality of output electrical cables (e.g., coaxial cables) may be electrically connected to and transmit the amplified and filtered MR signals from one or more electrical cable output connectors (e.g., coaxial cable output connectors) electrically connected to the outputs of the PCB of the body coil housing 104. The second part 110 of the base 102 may include an opening in the channel 114, such that the plurality of output electrical cables may pass through to the interior of the base 102.

The head coil housing 106 includes an internal surface 140 that forms a cavity 142 with the recess 112, and a first half or side 144 and a second half or side 146. The cavity 142 may be sized and shaped for the head of the patient. In one embodiment, the cavity 142 is generally semi-cylindrical. "Generally" allows for other shapes that are curved (e.g., an elliptic semi-cylinder). The head coil housing 106 may be rigid and may be made of any number of MRI-safe materials including, for example, polycarbonate. In an alternative embodiment, the head coil housing 106 is made of a flexible material including, for example, closed-cell foam. The head coil housing 106 may be solid or hollow.

The head coil housing 106 includes an attachment device (not shown) at or adjacent to the first side 144 of the head coil housing 106 and an attachment device 148 at or adjacent to the second side 146 of the head coil housing 106. The head coil housing 106 may be removably attached to corresponding attachment devices 150 (only one shown) located adjacent to the recess 112 of the first part 108 of the base 102. The attachment devices 148 may each include a button 152 (only one shown) that may be depressed to remove the head coil housing 106 from the base 102. Any number of other attachment devices including, for example, MRI-safe nut and bolt combinations and Velcro may be used. Alternatively, the head coil housing 106 is fixed to the base 102.

The head coil housing 106 may be one of a plurality of removably attachable head coil housings 106 of different sizes and shapes. The cross-section of the head coil housing 106 may be sized and shaped to match the cross-sectional size and shape of the head of the patient.

When the patient is positioned on the inner surface 124 of the body coil housing 104, the head of the patient is positioned on the surface of the recess 112 in the first part 108 of the base 102. Pillows or other filing materials (e.g., closed-cell foam) may be used to maintain the position of the head of the patient in the recess 112. After the patient has been positioned on the body coil housing 104, the head coil housing 106 may be physically attached to the base 102 with the attachment devices 148 and 150, such that the surface of the recess 112 is flush with the internal surface 140 of the head coil assembly 106.

A plurality of RF receive coils (not shown) may be integrated within the head coil housing 106. The plurality of RF receive coils is positionally fixed within the head coil housing 106. For example, all or part of at least some of the RF receive coils of the plurality may be embedded within a solid part of the head coil housing 106 or may be physically attached to an interior surface of the head coil housing 106 (e.g., if the head coil housing 106 is hollow). The plurality of RF receive coils may be spaced around the circumference of the head coil housing 106, such that MR signals may be received from the front and the sides of the head of the patient during MRI. In one embodiment, the head coil housing 106 includes both RF transmit coils and RF receive coils.

The plurality of RF receive coils of the head coil housing 106 may be made of any number of electrically conducting materials including, for example, copper. The plurality of RF receive coils of the head coil housing 106 may include, for example, surface coils, volume coils, or a combination thereof. In one embodiment, the head coil housing 106 includes only a single volume coil. In another embodiment, the head coil housing 106 includes a plurality of surface coils.

The plurality of RF receive coils of the head coil housing 106 may be electrically connected (e.g., soldered) to one or more electrical connectors of the head coil housing 106 (not shown), and the one or more electrical connectors of the head coil housing 106 may be physically and electrically connected to one or more corresponding electrical connectors (not shown) located in the base 102. The one or more electrical connectors of the head coil housing 106 and the one or more electrical connectors of the base 102 may be located adjacent to the attachment devices 148 and 150, respectively. The one or more electrical connectors of the head coil housing 106 and the one or more electrical connectors of the base 102 are positioned on the head coil housing 106 and the base, respectively, such that when the head coil housing 106 is physically attached to the base 102 with the attachment devices 148 and 150, the one or more electrical connectors of the head coil housing 106 and the one or more electrical connectors of the base 102 are also physically attached and electrically connected. Alternatively, one or more coaxial cables, for example, electrically connect the RF receive coils of the head coil housing 106 to the PCB of the body coil housing 104 or a different PCB. The first part 108 of the base 102 may include an opening or trough, such that the one or more coaxial cables electrically connected to the RF receive coils of the head coil housing 106 may pass through to the interior of the base 102.

The RF receive coils in the base 102 and the RF receive coils in the head coil housing 106 may be electrically connected (e.g., via coaxial cables or electrical connectors and coaxial cables) to inputs of the PCB of the body coil housing 104 (e.g., coaxial cable input connectors, leads or bond pads of the PCB). In one embodiment, the RF receive coils in the base 102 and the RF receive coils in the head coil housing 106 are electrically connected (e.g., via coaxial cables or electrical connectors and coaxial cables) to inputs of a PCB located in the base 102 (e.g., coaxial cable input connectors, leads or bond pads of the PCB). The PCB located in the base 102 may be a flexible, multilayered PCB, for example. At least one low-noise amplifier (not shown) may be electrically connected to the PCB of the base 102. The PCB of the base 102 may include more or fewer low-noise amplifiers than the combined number of RF receive coils of the base 102 and the head coil housing 106. The PCB of the base 102 may include any number of different, additional, fewer, or other electrical hardware components such as, for example, doubly balanced mixers, analog to digital converters, specialized processors (e.g., application specific integrated circuits (ASICs)), generalized processors, flash memory, resistors and capacitors electrically connected to the PCB of the base 102.

The pediatric coil assembly 100 may include twenty to thirty RF receive coils, for example (i.e., the RF receive coils of the base 102, the RF receive coils of the body coil housing 104 and the RF receive coils of the head coil housing 106 combined). The MR signals generated in the RF receive coils of the pediatric coil assembly 100 are amplified, filtered and transmitted from the outputs of the PCB of the base 102, the outputs of the PCB of the body coil housing 104 and/or the one or more electrical connectors located at the second part 110 of the base 102, to a coil connector 154 via a plurality of electrical output cables (e.g., coaxial cables), for example. In the embodiment shown in FIG. 1, the pediatric coil assembly 100 includes two coil connectors 154.

The coil connector 154 is physically connected to the base 102 by a coil cable 156, through which the plurality of electrical output cables run. The coil connector 154 includes a plurality of electrical connectors 158 (e.g., input and output electrical connectors 158). The plurality of electrical connectors 158 may include any number of connector types including, for example, pin connectors and cable connectors (e.g., coaxial cable connectors).

The coil connector 154 includes one or more output electrical connectors 158 electrically connected to the RF receive coils of the pediatric coil assembly 100 (e.g., via electrical input cables, the PCB of the body coil housing 104, and electrical output cables). The one or more output electrical connectors 158 are configured to output the MR signals generated in the RF receive coils of the pediatric coil assembly 100, and amplified and filtered in the low-noise amplifiers electrically connected to the PCB of the base 102 or the PCB of the body coil housing 104. The MR signals may be analog or digital signals (e.g., depending on whether the PCB of the base 102 or the PCB of the body coil housing 104 includes an analog to digital converter).

The coil connector 154 also includes one or more input electrical connectors 158 electrically connected to the PCB of the base 102 and/or the PCB of the body coil housing 104. An input electrical connector 158 may be electrically connected to the PCB of the base 102 and/or the PCB of the body coil housing 104 with one or more corresponding electrical cables soldered to the input electrical connector 158 and an input of the PCB of the base 102 and/or the PCB of the body coil housing 104. The one or more input electrical connectors 158 are configured to transmit data and power to control and power the electrical hardware components electrically connected to the PCB of the base 102 and/or the PCB of the body coil housing 104 (e.g., the at least one low-noise amplifier electrically connected to the PCB of the body coil housing 104).

The coil connector 154 is electrically connected to and physically attached to an MRI system-side connector (not shown). The connections are releasable, such as using mated plugs. The MRI system-side connector includes electrical connectors that are electrically connected to and physically attached to corresponding input and output electrical connectors 158. The MRI system includes a computer system that may include analog-to-digital converters electrically connected to the MRI system-side connector to convert the filtered and amplified MR signals received at the MRI system-side connector from analog to digital signals (e.g., digitized MR signals).

The computer system of the MRI system may include a processor electrically connected to a memory and a display. The digitized MR signals may be stored in the memory and further processed by the processor for image reconstruction using, for example, a 2-dimensional Fourier transformation. The display may display the results of image reconstruction. The processor may include a plurality of general processors, digital signal processors, application specific integrated circuits, combinations thereof, or other now known or later developed processor. The memory may include one or more of a read only memory (ROM), dynamic random access memory (DRAM), an optical or magnetic storage device, or any other type of memory or data storage device. The display may be a cathode ray tube (CRT) display, a liquid crystal display (LCD) or a light emitting diode (LED) display, for example.

Figure 2:
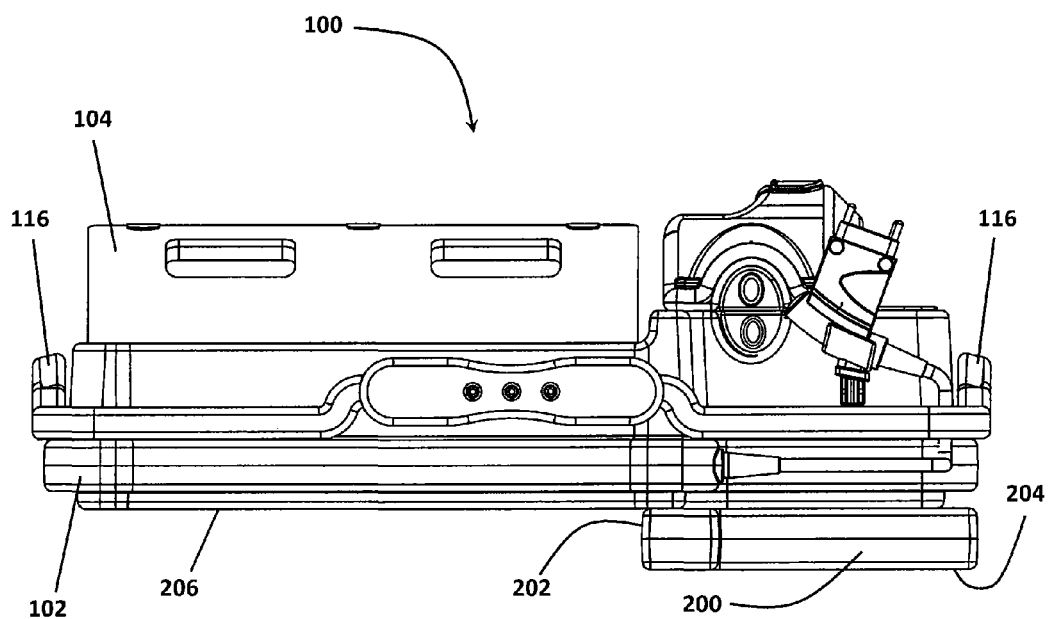
FIG. 2 illustrates a side view of one embodiment of a pediatric coil assembly.
Figure 3:
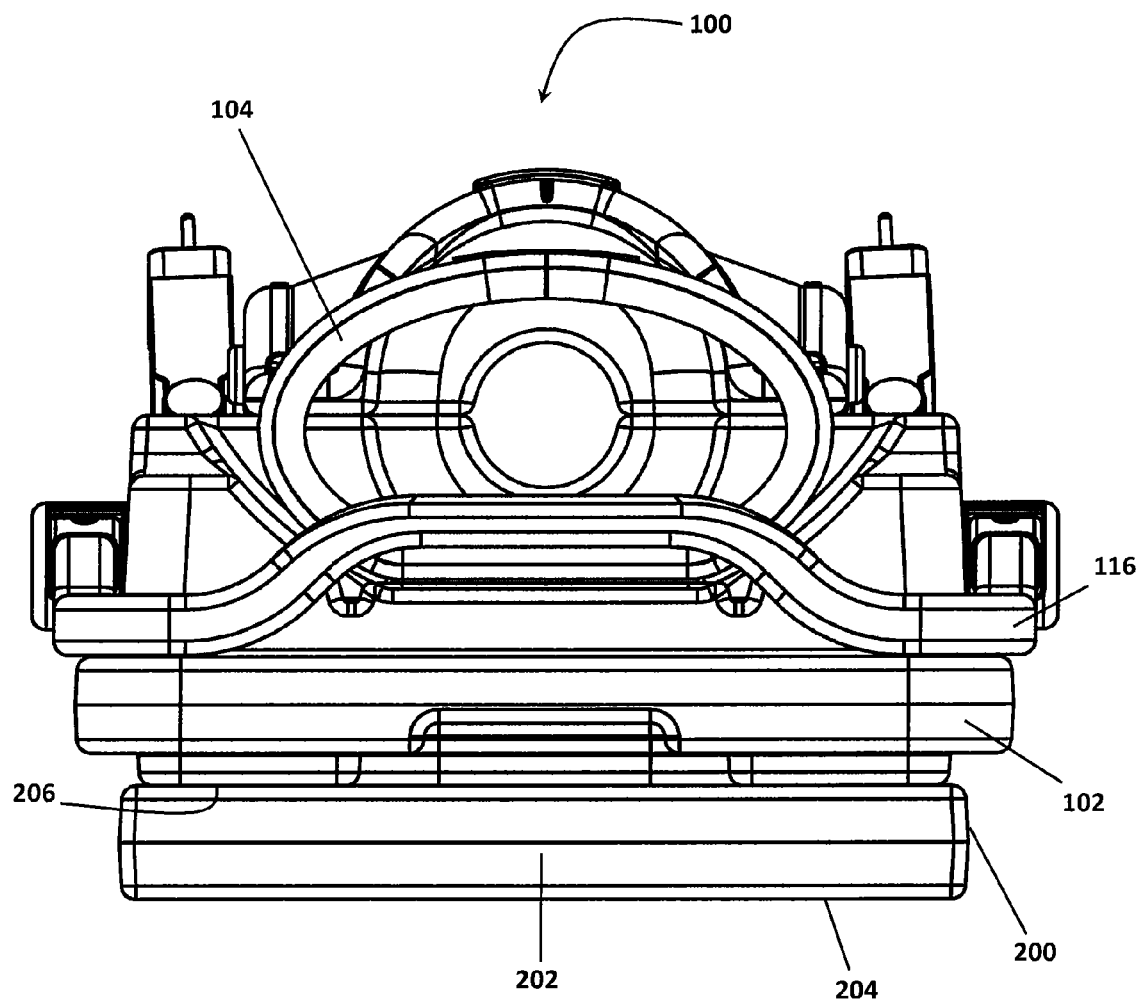
FIG. 3 illustrates a front view of one embodiment of a pediatric coil assembly.
Figure 4:
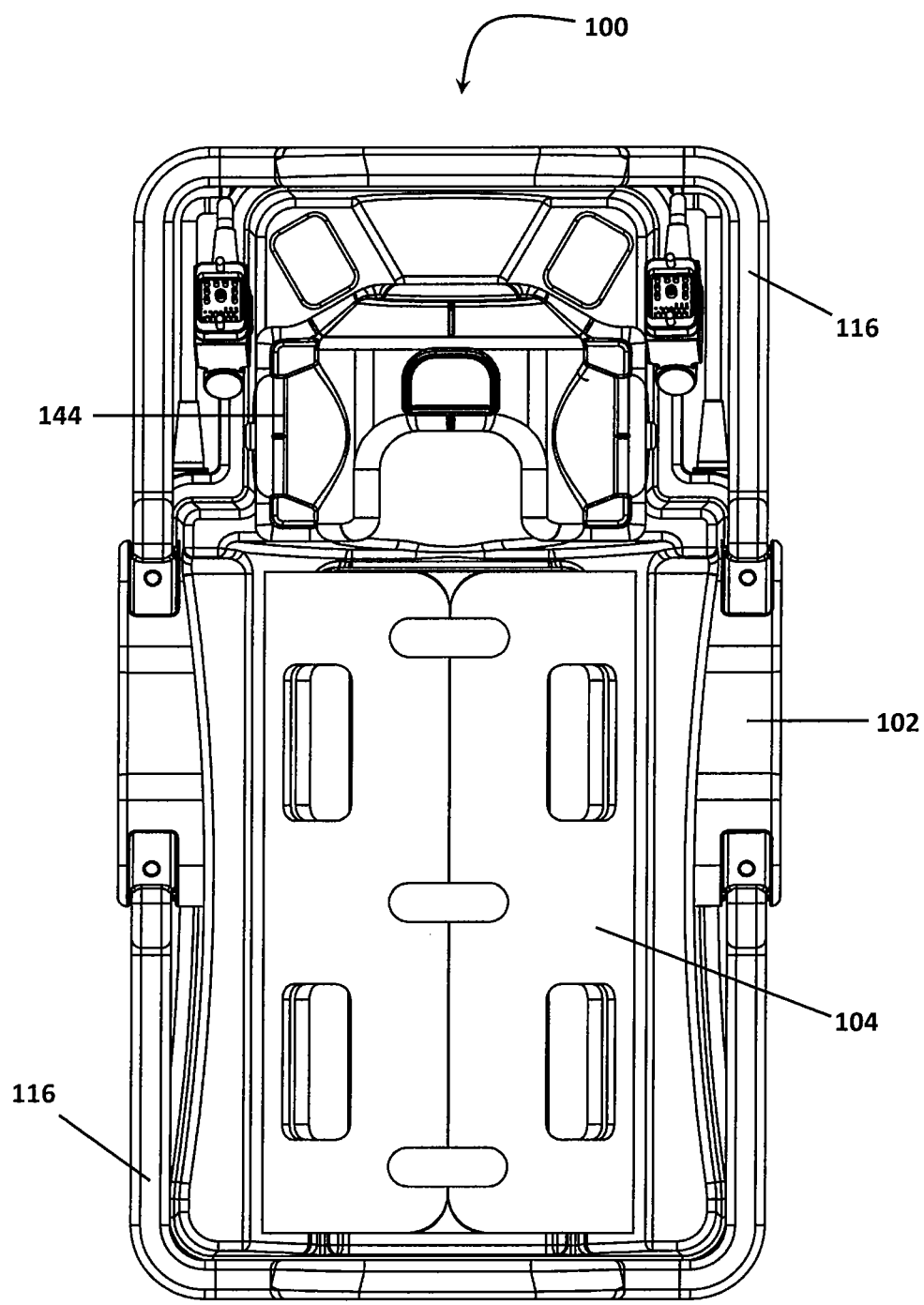
FIG. 4 illustrates a top view of one embodiment of a pediatric coil assembly.

FIGS. 2, 3 and 4 illustrate a side, front and top view, respectively, of one embodiment of the pediatric coil assembly 100 shown in FIG. 1 or a different pediatric coil assembly. As shown in FIG. 2, the pediatric coil assembly 100 includes a spine coil adapter plate 200. The spine coil adapter plate 200 includes a first side 202 and a bottom surface 204. The spine coil adapter plate 200 extends away from a bottom surface 206 of the base 102. The spine coil adapter plate 200 may have the same width as the base 102 of the pediatric coil assembly 100 and may extend at least part of the length of the base 102. In other embodiments, the width of the spine coil adapter plate 200 may be larger or smaller than the width of the base 102 of the pediatric coil assembly 100. The spine coil adaptor plate 200 is a separate device fixed to the base 102 or is formed as part of the base 102. In one embodiment, the pediatric coil assembly 100 does not include the spine coil adapter plate 200.

An MRI system may include a patient table, on which a patient to be imaged lies. A spine coil housing that includes one or more RF transmit and/or receive coils may be supported by the patient table. The size and shape of the RF coils of the spine coil housing may be optimized for older children (e.g., older than four years) and/or adults. In order to increase the signal to noise ratio, and thus increase the quality of images produced during pediatric MRI, RF receive coils in the base 102 and the body coil housing 104 of the pediatric coil assembly 100 may be used instead of the RF receive coils of the spine coil housing to image the spine of the patient (e.g., a child four years old and younger). The user of the MRI system (e.g., a nurse or a doctor), however, may not remove the spine coil housing from the patient table because of the difficulty of moving the spine coil housing and/or the disruption in workflow caused by moving the spine coil housing, for example.

The user may carry the pediatric coil assembly 100 and the patient located in the pediatric coil assembly 100 from a first room to a second room (e.g., a room, in which the MRI system is located) using the plurality of handles 116, for example. The user may place the pediatric coil assembly 100 on the patient table of the MRI system, such that the bottom surface 204 of the spine coil adapter plate 200 is supported by, is attached to or abuts a top surface of the patient table, and the bottom surface 206 of the base 102 is supported by, is attached to or abuts a top surface of the spine coil housing of the MRI system. In other words, the height of the spine coil adapter plate 200 may be approximately the same as the height of the spine coil housing of the MRI system. The spine coil adapter plate 200 allows the patient located in the pediatric coil assembly 100 to lay approximately parallel to the top surface of the patient table when the spine coil housing is not removed from the patient table.

Figure 5:
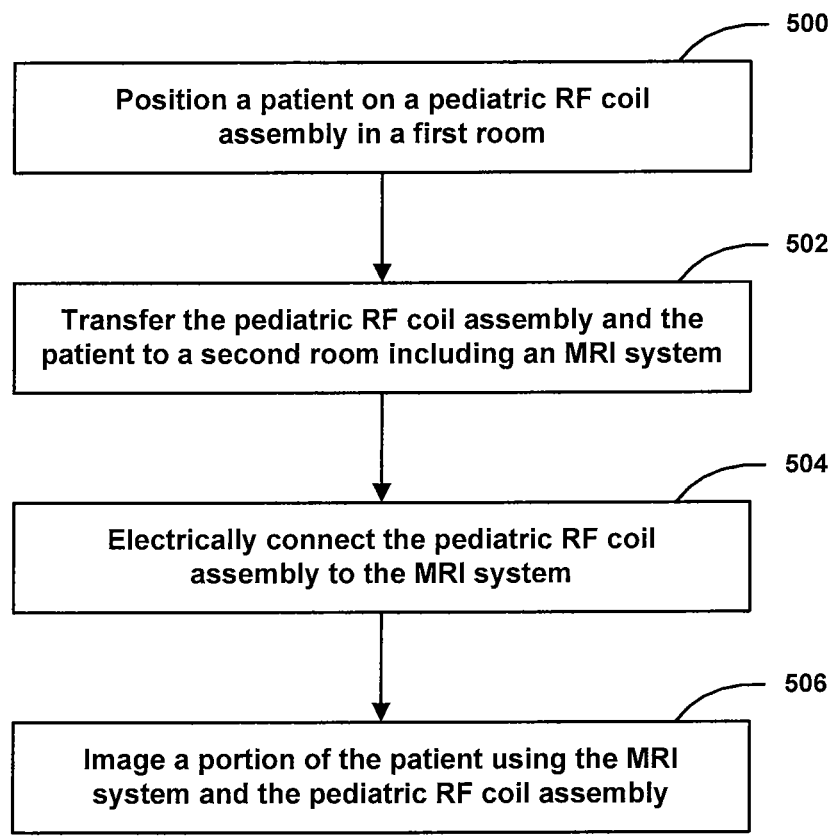
FIG. 5 illustrates a flow chart of one embodiment of a method of using one embodiment of a pediatric coil assembly.

FIG. 5 illustrates a flow chart of one embodiment of a method of using one embodiment of the pediatric coil assembly 100 shown in FIGS. 1-4 or a different pediatric coil assembly. The method is implemented in the order shown, but other orders may be used. Additional, different, or fewer acts may be provided.

At block 500, a patient is positioned on a pediatric RF coil assembly in a first room. The pediatric RF coil assembly includes a flexible body coil housing and a head coil housing. The flexible body coil housing and the head coil housing are supported by or removably attached to, or abut a base or each other. The flexible body coil housing is sized and shaped, such that the flexible body coil housing may be wrapped entirely around the body of a child (e.g., a child four and younger) to be imaged. In one embodiment, the flexible body coil housing only partly wraps around the body of the child.

The head coil housing is sized and shaped to match the cross-sectional size and shape of the head of the child, such that the head coil housing at least partly surrounds the head of the child. The flexible body coil housing may be made of any number of flexible MRI safe materials including, for example, closed-cell foam. The head coil housing may be made of any number of rigid MRI safe materials including, for example, polycarbonate. In one embodiment, the head coil housing is made of a flexible MRI safe material such as, for example, closed-cell foam.

Positioning the child on the pediatric RF coil assembly may include positioning the child, such that at least part of the body of the child abuts a top surface of the flexible body coil housing. The flexible body coil housing may be wrapped around the body of the child, such that the body coil housing at least partly surrounds the body of the child. The flexible body coil housing may serve as a blanket to keep the child warm during a procedure. In one embodiment, the flexible body coil housing is waterproof and easily cleaned (e.g., made of a waterproof closed-cell foam). The head coil housing may be removably attached to the base of the pediatric RF coil assembly after the child has fallen asleep or the child has been sedated (e.g., for long procedures), for example. The head coil housing may be one of a plurality of removably attachable head coil housings of different sizes and shapes, the cross-section of the head coil housing being sized and shaped to match the cross-sectional shape and size of the head of the child.

At block 502, the pediatric RF coil assembly and the patient are transferred to a second room or to another position in the same room that includes an MRI system. The pediatric RF coil assembly may include at least one handle attached to the base of the pediatric RF coil assembly. The user may transfer the pediatric RF coil assembly and the child positioned on the pediatric RF coil assembly using the at least one handle, for example. The handle may rotate for ease of carrying. The user may position the pediatric RF coil assembly on a patient table of the MRI system, such that a bottom surface of the base of the pediatric RF coil assembly is approximately parallel to a top surface of the patient table.

A spine coil housing including RF receive coils shaped and sized for older children (e.g., older than four) and/or adults may be supported by or attached to the top surface of the patient table of the MRI system. The user may not remove the spine coil housing from the patient table because the spine coil housing is heavy, difficult to move, or doing so would interrupt workflow, for example. In one embodiment, the base of the pediatric RF coil assembly includes a spine coil adapter plate that extends along a part of the length of the base and extends away from the base in a direction generally perpendicular to the bottom surface of the base. "Generally" allows for other angles while still extending in a direction away from the bottom surface of the base. The bottom surface of the base is supported by, is attached to, or abuts a top surface of the spine coil housing, while a bottom surface of the spine coil adapter plate is above, is supported by, is attached to, or abuts the top surface of the patient table of the MRI system.

The second room is separate from the first room, which may be a preparation room, for example. The child may be positioned on the pediatric RF coil assembly in the first room, while other patients are being imaged with the MRI system in the second room. The user may conduct more MRI procedures in a day than if each patient had to be positioned in the RF pediatric coil assembly and coaxed to sleep or sedated in the second room before each MRI procedure. The workflow may thus be optimized.

In one embodiment, the base of the pediatric RF coil assembly remains positioned on the patient table of the MRI system in the second room over the course of a number of MRI procedures. The child may be positioned on the flexible body coil housing, and brought to sleep or sedated in the first room. The flexible body coil housing and the child located on the flexible body coil housing may then be transferred to the second room. The flexible body coil housing may be physically attached and electrically connected (e.g., with coaxial cables and/or electrical connectors) to the base of the pediatric RF coil assembly positioned on the patient table. In one embodiment, the flexible body coil housing may be physically supported by the base of the body coil but may be electrically connected to the MRI system independent of the base of the pediatric RF coil assembly.

At block 504, the pediatric RF coil assembly is electrically connected to the MRI system. Outputs of the one or more PCBs may be electrically connected (e.g., with coaxial cables and/or electrical connectors) to a coil connector, which is configured to be physically attached to and electrically connected to an MRI system-side connector. The coil connector may include any number of electrical connectors including, for example, pin connectors and coaxial cable connectors. The coil connector is configured to output the amplified and filtered MR signals (e.g., analog signals) to the MRI system via the MRI system-side connector.

At block 506, a portion of the patient is imaged using the MRI system and the pediatric RF coil assembly. The coils in the pediatric RF coil assembly are used to detect. The MRI system includes a computer system that may include analog to digital converters electrically connected to the MRI system-side connector to convert the filtered and amplified MR signals received at the MRI system-side connector from analog to digital signals (e.g., digitized MR signals). The computer system of the MRI system may include a processor electrically connected to a memory and a display. The digitized MR signals may be stored in the memory and further processed by the processor for image reconstruction using, for example, a 2-dimensional Fourier transformation. The display may display the results of image reconstruction.

Various embodiments described herein can be used alone or in combination with one another. The foregoing detailed description has described only a few of the many possible implementations of the present invention. For this reason, this detailed description is intended by way of illustration, and not by way of limitation.

The invention claimed is:

1. A pediatric radiofrequency (RF) coil assembly comprising:
   a base comprising a first RF coil;
   a flexible body coil housing comprising an inner surface, an outer surface, and at least one side extending between the inner surface and the outer surface, a portion of the outer surface of the flexible body coil housing abutting the base and the flexible body coil housing being removable from the base, the flexible body coil housing comprising a second RF coil, a patient being positionable on the inner surface of the flexible body coil housing such that the flexible body coil housing supports the patient;
   a head coil housing removably attached to the base, the head coil housing comprising a third RF coil and operable to at least partially surround the head of the patient located on the pediatric RF coil assembly; and
   a handle rotatably attached to the base and configured for carrying the pediatric RF coil assembly when the patient is positioned on the pediatric RF coil assembly.

2. The pediatric RF coil assembly of claim 1, wherein the flexible body coil housing is operable to at least partially surround the body of the patient located on the pediatric RF coil assembly.

3. The pediatric RF coil assembly of claim 1, wherein the head coil housing is one of a plurality of head coil housings attachable to the base, each head coil housing of the plurality having a different size.

4. The pediatric RF coil assembly of claim 1, wherein the base, the flexible body coil housing and the head coil housing combined comprise between 20 and 30 RF coils.

5. The pediatric RF coil assembly of claim 1, wherein the third RF coil is a volume coil.

6. The pediatric RF coil assembly of claim 1, wherein at least part of the head coil housing is made of polycarbonate.

7. The pediatric RF coil assembly of claim 1, wherein the flexible body coil housing comprises a first section, a second section, and a third section, the first section being rigid, and the second section and the third section being flexible.

8. The pediatric RF coil assembly of claim 7, wherein the second section is attached to a first side of the first section, and the third section is attached to a second side of the first section.

9. The pediatric RF coil assembly of claim 8, wherein the flexible body coil housing comprises a first hinge and a second hinge, and
   wherein the second section is attached to the first side of the first section via the first hinge, and the third section is attached to the second side of the first section via the second hinge.

10. A method of using a pediatric radiofrequency (RF) coil assembly, the pediatric RF coil assembly comprising a base, a flexible body coil housing, a head coil housing, and a handle, the base comprising a first RF coil, the flexible body coil housing comprising an inner surface, an outer surface, at least one side extending between the inner surface and the outer surface, and a second RF coil, and the flexible body coil housing being removable from the base, a patient being positionable on the inner surface of the flexible body coil housing such that the flexible body coil housing supports the patient, the head coil housing being removably attached to the base, the head coil housing comprising a third RF coil and being operable to at least partially surround the head of the patient located on the pediatric RF coil assembly, the handle being rotatably attached to the base and configured for carrying the pediatric RF coil assembly when the patient is positioned on the pediatric RF coil assembly, the method comprising:
    positioning the patient on the inner surface of the flexible body coil housing of the pediatric RF coil assembly such that the flexible body coil housing supports the patient in a first room, at least a portion of the outer surface of the flexible body portion abutting the base;
    wrapping the flexible body coil housing of the pediatric RF coil assembly around at least part of the patient;
    transferring the pediatric RF coil assembly and the patient to a second room, the second room including a magnetic resonance imaging (MRI) system, wherein transferring the pediatric RF coil assembly and the patient comprises using the handle rotatably attached to the base;
    electrically connecting the pediatric RF coil assembly to the MRI system;
    imaging a portion of the patient using the MRI system and at least one coil in the pediatric RF coil assembly.

11. The method of claim 10, wherein positioning the patient on the pediatric RF coil assembly comprises:
    the wrapping of the flexible body portion of the pediatric RF coil assembly around at least the part of the patient, wherein the RF coil of the flexible body portion is operable to be electrically connected to the MRI system.

12. The method of claim 11, wherein positioning the patient on the pediatric RF coil assembly further comprises fixing the position of a first end of the flexible body portion relative to a second end of the flexible body portion with a fastener attached to a second surface of the flexible body portion.

13. The method of claim 10, wherein the RF coil of the flexible body portion is a first RF coil,
    wherein the method further comprises attaching a head portion comprising a second RF coil to the pediatric RF coil assembly after the patient has been positioned on the pediatric RF coil assembly, and
    wherein the second RF coil is operable to be electrically connected to the MRI system.

\* \* \* \* \*